United States Patent
Hung et al.

(10) Patent No.: US 8,227,282 B2
(45) Date of Patent: Jul. 24, 2012

(54) METHOD OF MANUFACTURING VERTICAL LIGHT EMITTING DIODE

(75) Inventors: Tzu-Chien Hung, Hsinchu Hsien (TW);
Chia-Hui Shen, Hsinchu Hsien (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/028,158

(22) Filed: Feb. 15, 2011

(65) Prior Publication Data
US 2012/0021545 A1    Jan. 26, 2012

(30) Foreign Application Priority Data
Jul. 23, 2010    (CN) .......................... 2010 1 0235211

(51) Int. Cl.
*H01L 21/00* (2006.01)
*H01L 21/46* (2006.01)
*H01L 21/36* (2006.01)

(52) U.S. Cl. ................ 438/46; 438/22; 438/28; 438/41; 438/483; 438/455; 257/E21.002; 257/E21.088; 257/E21.122; 257/E33.013

(58) Field of Classification Search ........... 257/E21.002, 257/E21.088, E21.122, E33.013
See application file for complete search history.

(56) References Cited

U.S. PATENT DOCUMENTS

| | | | |
|---|---|---|---|
| 2007/0262341 A1* | 11/2007 | Liu et al. | 257/103 |
| 2008/0217634 A1* | 9/2008 | Liu et al. | 257/98 |
| 2011/0143466 A1* | 6/2011 | Chen et al. | 438/29 |

* cited by examiner

*Primary Examiner* — Mohsen Ahmadi
(74) *Attorney, Agent, or Firm* — Altis Law Group, Inc.

(57) ABSTRACT

A method of manufacturing a vertical light emitting diode includes: providing a first substrate; forming a lapping stop layer on the first substrate, the lapping stop layer being harder than the first substrate; depositing an epitaxial layer on the lapping stop layer; bonding a second substrate on the epitaxial layer; and removing the first substrate from the lapping stop layer.

11 Claims, 8 Drawing Sheets

METHOD OF MANUFACTURING VERTICAL LIGHT EMITTING DIODE

BACKGROUND

1. Technical Field

The present disclosure relates generally to light emitting devices, and more particularly to a method of manufacturing a vertical light emitting diode (LED).

2. Description of Related Art

Generally, a nitride-based semiconductor LED is grown on a sapphire substrate, but the sapphire substrate is a rigid nonconductor and has poor thermal conductivity. Therefore, there is a limitation in reducing the manufacturing costs by reducing the size of a nitride-based semiconductor LED, or improving the optical power and chip characteristic. Particularly, because the application of a high current is essential for achieving high power LED, it is important to solve a heat dissipation problem of the LED. To solve this problem, there has been proposed a vertical LED in which a sapphire substrate is removed by using a laser lift off (LLO) technique or a lapping process.

However, the LLO technique may be inadequate and inefficient for manufacturing large size LED due to a high cost thereof. In addition, cracks may occur at the edge of a light emitting structure of the LED, which reduces the reliability of the LED. Although the lapping process has the advantage of low cost and high efficiency compared with the LLO technique, it is difficult to differentiate the interface between different layers of the LED, resulting in a high risk of damage of the light emitting structure of the LED.

What is needed therefore is a method of manufacturing a vertical light emitting diode which can overcome the above mentioned limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the views.

DETAILED DESCRIPTION

The present invention now will be described more fully hereinafter with reference to the accompanying drawings, in which embodiments of the invention are shown. It is understood that when an element such as a layer, region or substrate is referred to as being "on" another element, it can be directly on the other element or intervening elements may also be present. It is understood that if part of an element, such as a surface, is referred to as "outer", it is near from the outside of the device than other parts of the element. Furthermore, the term "directly" means that there are no intervening elements.

Figure 1:
FIGS. 1-7 are cross sectional views of a vertical light emitting diode in different manufacturing steps of a method in accordance with an embodiment of the present disclosure.

Referring to FIG. 1, a first substrate 11 is provided. The first substrate 11 may be one of sapphire, Si, GaAs, InP, SiC, or other suitable materials.

Figure 2:
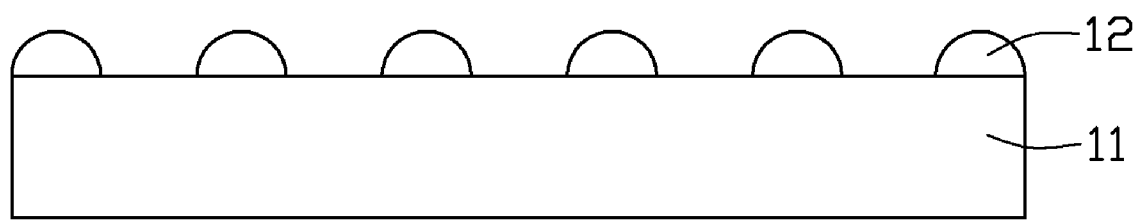

Referring to FIG. 2, a lapping stop layer 12 is formed on or directly formed on the first substrate 11. A hardness of the lapping stop layer 12 is larger than that of the first substrate 11. The lapping stop layer 12 is preferred to transparent, whereby it is not needed to be removed in the following procedure. It is understood that the lapping stop layer 12 may also be opaque which should be removed in the following procedure to increase a light emitting efficiency of the light emitting diode. The lapping stop layer 12 may be one of diamond, diamond like carbon (DLC), SiC, $Al_2O_3$, quartz, $Si_3N_4$, $SiO_2$, GaN, AlN, InN or other suitable materials, or a mixture of two or more of diamond, DLC, SiC, $Al_2O_3$, quartz, $Si_3N_4$, $SiO_2$, GaN, AlN, InN. The lapping stop layer 12 may be formed on the first substrate 11 by a process of metal organic chemical vapor deposition (MOCVD), plasma-enhanced chemical vapor deposition (PECVD), evaporating, sputtering, or other chemical or physical processes. The lapping stop layer 12 may be configured as dots, islands, plates or other suitable shapes. The lapping stop layer 12 is evenly distributed on a surface of the first substrate 11. Voids defined in the lapping stop layer 12 may be a path of circuit, and also a place for deposition of an epitaxial layer 13 (FIG. 3) with high quality. The lapping stop layer 12 is 0.7-2 μm thick, which is a benefit for growing the epitaxial layer 13.

Figure 3:
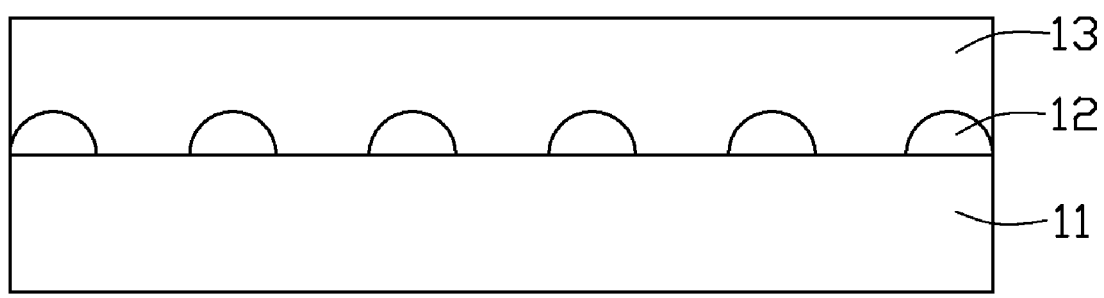

As shown in FIG. 3, the epitaxial layer 13 is grown on the lapping stop layer 12. The epitaxial layer 13 is a multi-layered structure composed of semiconductor compounds. The semiconductor compounds include semiconductors of Group III-V or Group II-VI, and a typical one is a GaN-based semiconductor.

Figure 4:
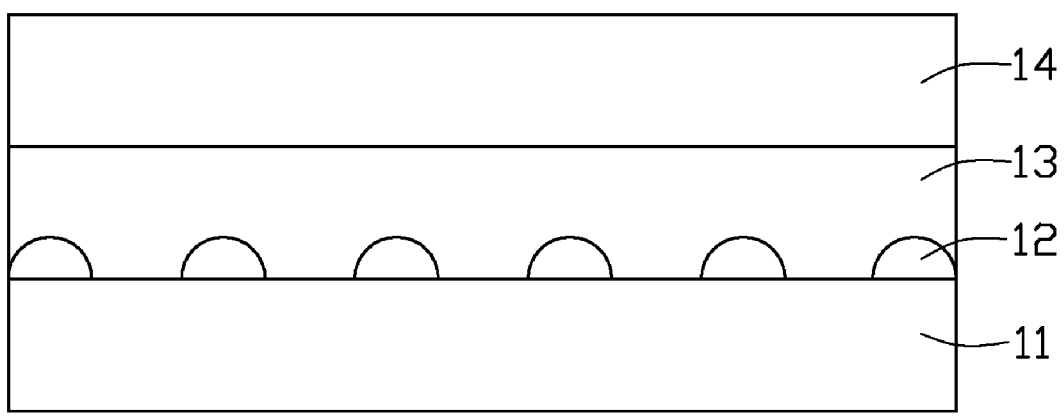

Referring to FIG. 4, a second substrate 14 is bonded to the epitaxial layer 13. The second substrate 14 may be one of Si, Al, Cu or other suitable conductive materials. Bonding the second substrate 14 on the epitaxial layer 13 may be accomplished with metallic bonding, adhesion, electronic plating, chemical plating or spin-coating, etc.

Figure 5:
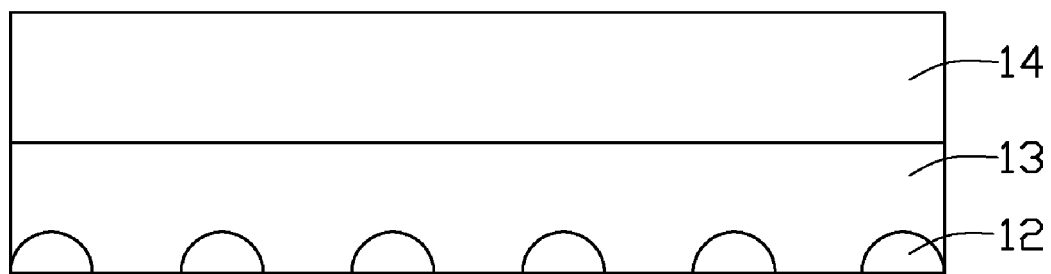

As shown in FIG. 5, the first substrate 11 is removed by grinding, lapping or polishing. Since the lapping stop layer 12 is harder than the first substrate 11, lapping speeds of the two are quite different, and the lapping can be stopped precisely as soon as the lapping tool touches the lapping stop layer 12. Thereby, the epitaxial layer 13 is avoided to be lapped away by the lapping tool.

Figure 6:
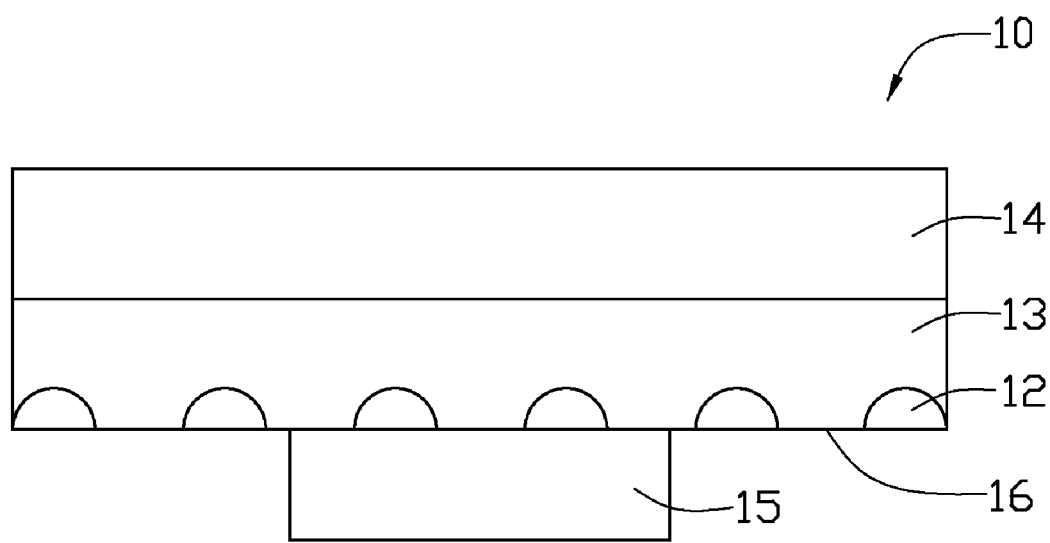

As shown in FIG. 6, the lapping stop layer 12 is still remained in the epitaxial layer 13. An exposed bottom portion of the epitaxial layer 13 and an exposed bottom portion of the lapping stop layer 12 cooperatively form a compound surface 16. When the lapping stop layer 12 is transparent, there is no need to remove the lapping stop layer 12, and an electrode 15 can be directly formed on the compound surface 16 to form a vertical light emitting diode 10.

Figure 7:
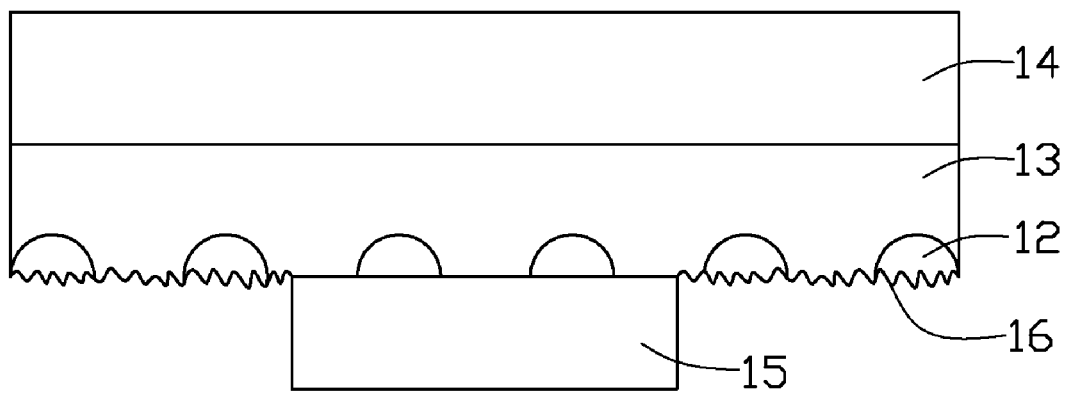

In addition, the present embodiment comprises roughening the compound surface 16 by wet or dry etching for increasing a light output efficiency of the light emitting diode 10, as illustrated in FIG. 7.

Figure 8:
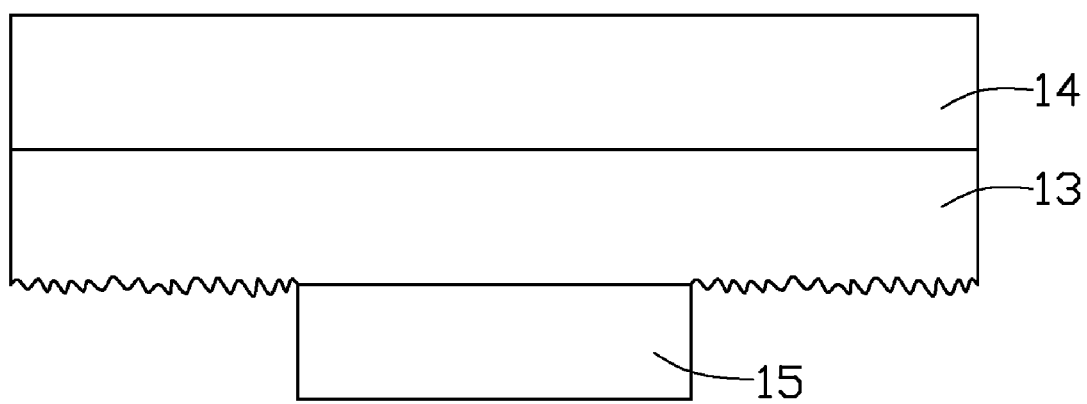
FIG. 8 is a cross sectional view of a light emitting diode obtained by a method in accordance with an alternative embodiment of the present disclosure.

Referring to FIG. 8, in an alternative embodiment, the lapping stop layer 12 can be removed by etching (such as inductively coupled plasma etching) to expose the epitaxial layer 13. The electrode 15 can be plated on the epitaxial layer 13. Accordingly, an outer surface of the epitaxial layer 13 can also be roughened to increase the light output efficiency of the light emitting diode 10.

The method of the present disclosure utilizing the characteristic of the different lapping speeds between the first substrate 11 and the lapping stop layer 12, to precisely control a lapping value and prevent from destroying the epitaxial layer 13. The method of the present disclosure is more suitable for manufacturing larger wafer and may save time and cost.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A method of manufacturing a vertical light emitting diode, the method comprising:
   providing a first substrate;
   forming a lapping stop layer on the first substrate, the lapping stop layer being harder than the first substrate;
   depositing an epitaxial layer on the lapping stop layer;
   bonding a second substrate on the epitaxial layer;
   removing the first substrate from the lapping stop layer;
   wherein the lapping stop layer is transparent, and the first substrate is removed to expose the lapping stop layer and the epitaxial layer, the lapping stop layer and the epitaxial layer cooperatively forming a compound surface, the method further comprising forming an electrode on the compound surface; and
   roughening the compound surface after forming the electrode.

2. The method of claim 1, wherein the lapping stop layer is one or more selected from diamond, diamond like carbon, SiC, $Al_2O_3$, quartz, $Si_3N_4$, $SiO_2$, GaN, AlN, InN.

3. The method of claim 1, wherein the lapping stop layer is configured to be dots, islands or plates.

4. The method of claim 1, wherein the lapping stop layer is 0.7-2 μm thick.

5. The method of claim 1, wherein the first substrate is Si, and the lapping stop layer is GaN.

6. The method of claim 1, wherein the lapping stop layer is opaque, after removing the first substrate, the method further comprising removing the lapping stop layer to expose the epitaxial layer, and forming an electrode on the epitaxial layer.

7. The method of claim 6 further comprising roughening an outer surface of the epitaxial layer after forming the electrode.

8. The method of claim 6, wherein the removal of the lapping stop layer is accomplished by etching the lapping stop layer.

9. The method of claim 1, wherein bonding the second substrate on the epitaxial layer is accomplished by metallic bonding, adhesion, electronic plating, chemical plating or spin-coating.

10. The method of claim 9, wherein the second substrate is selected from Si, Al, Cu.

11. The method of claim 1, wherein the first substrate is removed from the lapping stop layer by lapping, grinding or polishing.

* * * * *